(12) United States Patent
Adel et al.

(10) Patent No.: US 10,409,171 B2
(45) Date of Patent: Sep. 10, 2019

(54) OVERLAY CONTROL WITH NON-ZERO OFFSET PREDICTION

(71) Applicant: KLA-Tencor Corporation, Milpitas, CA (US)

(72) Inventors: Michael E. Adel, Ya'akov (IL); Amnon Manassen, Haifa (IL); William Pierson, Austin, TX (US); Ady Levy, San Jose, CA (US); Pradeep Subrahmanyan, Cupertino, CA (US); Liran Yerushalmi, Zicron Yaacob (IL); DongSub Choi, Yongin (KR); Hoyoung Heo, Gyeonggi-do (KR); Dror Alumot, Rehovot (IL); John Charles Robinson, Austin, TX (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 15/867,485

(22) Filed: Jan. 10, 2018

(65) Prior Publication Data
US 2018/0253017 A1    Sep. 6, 2018

Related U.S. Application Data

(60) Provisional application No. 62/450,454, filed on Jan. 25, 2017.

(51) Int. Cl.
*G03B 27/00* (2006.01)
*G03F 7/20* (2006.01)

(52) U.S. Cl.
CPC .......... *G03F 7/70633* (2013.01); *G03F 7/705* (2013.01); *G03F 7/7085* (2013.01); *G03F 7/70508* (2013.01)

(58) Field of Classification Search
CPC .. G03F 7/705; G03F 7/70508; G03F 7/70633; G03F 7/7085
See application file for complete search history.

(56) References Cited

U.S. PATENT DOCUMENTS

| 2004/0159397 A1 | 8/2004 | Bode et al. |
| 2009/0162759 A1 | 6/2009 | Ogata et al. |

(Continued)

FOREIGN PATENT DOCUMENTS

CN    104934338 A    9/2015

OTHER PUBLICATIONS

International Search Report and Written Opinion dated May 8, 2018 for PCT/US2018/015104.

*Primary Examiner* — Peter B Kim
(74) *Attorney, Agent, or Firm* — Suiter Swantz pc llo

(57) ABSTRACT

A process control system may include a controller configured to receive after-development inspection (ADI) data after a lithography step for the current layer from an ADI tool, receive after etch inspection (AEI) overlay data after an exposure step of the current layer from an AEI tool, train a non-zero offset predictor with ADI data and AEI overlay data to predict a non-zero offset from input ADI data, generate values of the control parameters of the lithography tool using ADI data and non-zero offsets generated by the non-zero offset predictor, and provide the values of the control parameters to the lithography tool for fabricating the current layer on the at least one production sample.

39 Claims, 11 Drawing Sheets

(56) References Cited

U.S. PATENT DOCUMENTS

| | | | |
|---|---|---|---|
| 2014/0065736 A1* | 3/2014 | Amir | H01L 23/544 |
| | | | 438/14 |
| 2015/0162206 A1 | 6/2015 | Liao et al. | |
| 2016/0078166 A1 | 3/2016 | Unal et al. | |

* cited by examiner

OVERLAY CONTROL WITH NON-ZERO OFFSET PREDICTION

CROSS-REFERENCE TO RELATED APPLICATION

The present application claims the benefit under 35 U.S.C. § 119(e) of U.S. Provisional Application Ser. No. 62/450,454, filed Jan. 25, 2017, entitled NON ZERO OFFSET PREDICTION IN OVERLAY CONTROL, naming Mike Adel, Amnon Manassen, Bill Pierson, Ady Levy, Pradeep Subrahmanyan, Liran Yerushalmi, Dongsub Choi, Hoyoung Heo, Dror Alumot, and John Robinson as inventors, which is incorporated herein by reference in the entirety.

TECHNICAL FIELD

The present disclosure relates generally to overlay control and, more particularly, to overlay control using non-zero offset prediction.

BACKGROUND

Semiconductor devices typically include multiple patterned material layers in which each successive layer must be aligned to previous layers within tight tolerances. Accordingly, fabrication lines may utilize a process control system incorporating feedback and/or feedforward control data to monitor and adjust the settings of fabrication tools to maintain overlay errors (e.g., overlay registration errors between layers) within selected tolerances. Advanced process control systems providing tight overlay control typically integrate control data generated at multiple steps in the fabrication process from multiple types of equipment. For example, after development inspection (ADI) data may typically be generated using an optical metrology tool to provide high throughput analysis. By way of another example, after etch inspection (AEI) data may typically be provided by an electron-beam metrology tool to provide higher-resolution, but lower throughput analysis.

However, overlay errors measured at different stages of fabrication and/or by different metrology tools may differ. This difference between offset error measurements used as control data is termed non-zero offset (NZO) and may vary spatially across a particular sample and/or temporally across multiple samples in the same or different lots. In this regard, NZO may introduce instability into the process control system and may decrease performance. Therefore, it is desirable to develop systems and methods to cure deficiencies such as those identified above.

SUMMARY

A process control system is disclosed, in accordance with one or more illustrative embodiments of the present disclosure. In one illustrative embodiment, the process control system includes a controller configured to communicatively couple to a lithography tool fabricating a current layer to provide control parameters to maintain overlay error between the current layer and one or more previous layers within a selected specification. In another illustrative embodiment, the controller is configured to receive after-development inspection (ADI) data after a lithography step for the current layer from an ADI tool. In another illustrative embodiment, the ADI data includes ADI overlay data indicative of overlay errors between the current layer and the one or more previous layers, and ADI flag data indicative of process deviations during fabrication of the one or more previous layers. In another illustrative embodiment, the controller is configured to receive after etch inspection (AEI) overlay data after an exposure step of the current layer from an AEI tool, the AEI overlay data indicative of overlay errors between the current layer and the one or more previous layers in which a non-zero offset corresponds to a difference between overlay error determined from ADI data and AEI overlay data. In another illustrative embodiment, the controller is configured to train a non-zero offset predictor with ADI data and AEI overlay data from one or more training samples to predict a non-zero offset from ADI data. In another illustrative embodiment, the controller is configured to generate values of the control parameters of the lithography tool fabricating the current layer of at least one production sample using ADI data from one or more previous production samples and non-zero offsets generated by the non-zero offset predictor based on the ADI data from the one or more previous production samples. In another illustrative embodiment, the controller is configured to provide the values of the control parameters to the lithography tool for fabricating the current layer on the at least one production sample.

A process control system is disclosed in accordance with one or more illustrative embodiments of the present disclosure. In one illustrative embodiment, the process control system includes a controller configured to communicatively couple to a lithography tool fabricating a current layer to provide control parameters to maintain overlay error between the current layer and one or more previous layers within a selected specification. In another illustrative embodiment, the controller is configured to receive after-development inspection (ADI) data after a lithography step for the current layer from an ADI tool. In another illustrative embodiment, the ADI data includes ADI overlay data indicative of overlay errors between the current layer and the one or more previous layers, and ADI flag data indicative of process deviations during fabrication of the one or more previous layers. In another illustrative embodiment, the controller is configured to receive after etch inspection (AEI) overlay data after an exposure step of the current layer from an AEI tool. In another illustrative embodiment, the AEI overlay data is indicative of overlay errors between the current layer and the one or more previous layers. In another illustrative embodiment, a non-zero offset corresponds to a difference between overlay error determined from ADI data and AEI overlay data. In another illustrative embodiment, the controller is configured to generate values of the control parameters of the lithography tool fabricating the current layer of at least one production sample using ADI data and AEI data from one or more previous production samples. In another illustrative embodiment, the controller is configured to provide the values of the control parameters to the lithography tool for fabricating the current layer on the at least one production sample.

A process control system is disclosed in accordance with one or more illustrative embodiments of the present disclosure. In one illustrative embodiment, the process control system includes an after-development inspection (ADI) tool. In another illustrative embodiment, the process control system includes an after-etch inspection (AEI) tool. In another illustrative embodiment, the process control system includes a lithography tool for fabricating a current layer. In another illustrative embodiment, the process control system includes a controller. In another illustrative embodiment, the controller is configured to receive after-development inspection (ADI) data after a lithography step for the current layer from an ADI tool. In another illustrative embodiment, the ADI data includes ADI overlay data indicative of overlay errors between the current layer and the one or more previous layers, and ADI flag data indicative of process deviations during fabrication of the one or more previous layers. In another illustrative embodiment, the controller is configured to receive after etch inspection (AEI) overlay data after an exposure step of the current layer from an AEI tool, the AEI overlay data indicative of overlay errors between the current layer and the one or more previous layers in which a non-zero offset corresponds to a difference between overlay error determined from ADI data and AEI overlay data. In another illustrative embodiment, the controller is configured to train a non-zero offset predictor with ADI data and AEI overlay data from one or more training samples to predict a non-zero offset from ADI data. In another illustrative embodiment, the controller is configured to generate values of the control parameters of the lithography tool fabricating the current layer of at least one production sample using ADI data from one or more previous production samples and non-zero offsets generated by the non-zero offset predictor based on the ADI data from the one or more previous production samples. In another illustrative embodiment, the controller is configured to provide the values of the control parameters to the lithography tool for fabricating the current layer on the at least one production sample.

A process control method is disclosed in accordance with one or more illustrative embodiments of the present disclosure. In one illustrative embodiment, the method includes receiving after-development inspection (ADI) data after a lithography step for the current layer from an ADI tool, the ADI data including ADI overlay data indicative of overlay errors between a current layer and one or more previous layers in which the ADI data further includes ADI flag data indicative of process deviations during fabrication of the one or more previous layers. In another illustrative embodiment, the method includes receiving after etch inspection (AEI) overlay data after an exposure step of the current layer from an AEI tool in which, the AEI overlay data indicative of overlay errors between the current layer and the one or more previous layers. In another illustrative embodiment, a non-zero offset corresponds to a difference between overlay error determined from ADI data and AEI overlay data. In another illustrative embodiment, the method includes training a non-zero offset predictor with ADI data and AEI overlay data from one or more training samples to predict a non-zero offset from ADI data. In another illustrative embodiment, the method includes generating values of the control parameters of a lithography tool for fabricating the current layer of at least one production sample using ADI data from one or more previous production samples and non-zero offsets generated by the non-zero offset predictor based on the ADI data from the one or more previous production samples. In another illustrative embodiment, the control parameters maintain overlay error between the current layer and the one or more previous layers within a selected tolerance. In another illustrative embodiment, the method includes providing the values of the control parameters to the lithography tool for fabricating the current layer on the at least one production sample.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures in which.

DETAILED DESCRIPTION

Figure 1A:
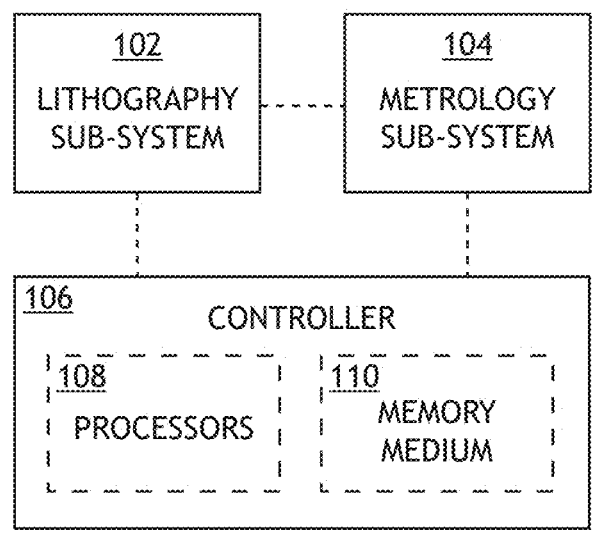
FIG. 1A is a conceptual view illustrating a semiconductor device system, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to a process control system for maintaining overlay between a current layer and one or more previous layers on a sample within a selected tolerance while reducing NZO associated with control data from different metrology tools. As used throughout the present disclosure, the term "sample" generally refers to a substrate formed of a semiconductor or non-semiconductor material (e.g., a wafer, or the like). For example, a sample may include, but is not limited to, monocrystalline silicon, gallium arsenide, and indium phosphide. Further, the material layers may include various materials such as, but not limited to, a resist, a dielectric material, a conductive material, or a semiconductive material. The sample may further include a plurality of dies, each having repeatable patterned features.

It is recognized herein that a semiconductor device may be formed as multiple layers of patterned or unpatterned material on a substrate. Each printed layer may be fabricated through a series of process steps such as, but not limited to, one or more material deposition steps, one or more lithography steps, or one or more etching steps. Further, each printed layer must typically be fabricated within selected tolerances to properly construct the final device. For example, pattern placement error (PPE) associated with the placement of printed elements on a sample must be well characterized and controlled. Further, registration errors between a current layer being fabricated and previously fabricated layers (e.g., overlay errors) must be also be tightly controlled.

Overlay errors may be introduced through varied sources. For example, overlay errors may be generated by grid errors associated with alignment of a reticle to the sample during an exposure step of one or more exposure fields. A lithography tool (e.g., a stepper, a scanner, or the like) may typically have a field of view (FOV) smaller than a full sample and may thus divide the sample into a series (e.g., a grid) of exposure fields (hereinafter referred to as fields) that may be separately exposed. Accordingly, grid errors may include misalignments of the reticle to the sample for each field in an exposure grid (e.g., grid errors), which may manifest as shifts of an exposure pattern of a current layer relative to a nominal location on the sample for each field. By way of another example, overlay errors may be generated by process errors. Process errors may include, but are not limited to, errors associated with the fabrication of three-dimensional structures on the sample based on the exposed patterns. For example, process errors may include, but are not limited to, distortions of an exposed pattern during lithography, etch-induced errors, or errors associated with variations in the sample.

Overlay is typically characterized using overlay metrology tools at one or more process steps. Further, overlay may be measured at varied locations across a sample such as, but not limited to, fabricated device structures or overlay targets. For example, overlay may be measured by comparing a portion of a fabricated structure to an expected structure. By way of another example, overlay may be measured on an overlay metrology target including fabricated features located on layers of interest positioned to provide a sensitive indication of overlay error between the layers.

Overlay metrology tools may utilize a variety of techniques to determine the overlay of sample layers. For example, image-based overlay metrology tools may capture an image of a portion of a sample (e.g., a device structure, an advanced imaging metrology (AIM) target, a box-in-box metrology target, or the like). Accordingly, overlay may be determined by measuring the relative positions of the imaged features. By way of another example, scatterometry-based overly metrology tools may illuminate a portion of a sample (e.g., device structure, a grating-over-grating metrology target, or the like) and capture an overlay signal including an angular distribution of radiation emanating from the sample associated with diffraction, scattering, and/or reflection of the illumination beam. Accordingly, overlay may be determined based on models of the interaction of an illumination beam with the overlay target.

It may be the case that the overlay may vary spatially across a particular sample. For example, grid and/or process errors may differ for each exposure field of a lithography tool. In this regard, overlay may be measured at representative locations across a sample and may be modeled to provide an overlay distribution. It may also be the case that the overlay at a given location (e.g., at a given exposure field) may vary temporally from one sample to the next or from one lot of samples to the next.

Additional embodiments of the present disclosure are directed to a process control system for adjusting control parameters (e.g., settings) of one or more fabrication tools (e.g., a lithography tool, or the like) to maintain overlay errors within a selected tolerance. For example, the process control system may generate control parameters (or corrections to the control parameters) for fabrication tools based on feedback and/or feedforward overlay data from overlay metrology tools. Feedback data for the control of fabrication tools for a current layer may be generated based on previous production runs of the fabrication of a current layer. Feedforward data may be generated based on devices or overlay metrology targets fabricated on one or more previous layers of a sample or in previous lots.

Additional embodiments of the present disclosure are directed to a process control system incorporating overlay data (e.g., as feedback and/or feedforward data) based on multiple overlay estimates generated at different fabrication stages and/or generated by different metrology tools to adjust the fabrication tool control parameters.

For example, ADI data may be generated by a non-destructive ADI metrology tool with a high-throughput and low move-acquire-measure time (MAMtime). In this regard, the ADI metrology tool may capture overlay data directly on samples during fabrication temporally proximate to the development step without damaging the samples. Further, identifying potential issues at this stage may facilitate reworking of samples in the current or future lots to correct the issues prior to a time-consuming and irreversible etching step. In one embodiment, an ADI metrology tool includes an optical metrology tool providing non-destructive measurements with a high precision and a high sampling rate. An optical ADI metrology tool may, but is not required to, operate an imaging mode or a scatterometry mode. However, it may be the case that an optical ADI metrology tool may not fully resolve device features due to optical resolution limits based on the wavelength of an illumination source. Accordingly, an optical ADI metrology tool may measure, but is not required to measure, overlay from overlay metrology targets having optically-resolvable features.

By way of another example, AEI data may be generated by an AEI metrology tool after an etching step. In this regard, the AEI data may incorporate overlay errors generated during any process step such as, but not limited to, deposition steps, exposure steps, development steps, or etching. Further, the AEI metrology tool may have a resolution sufficient to resolve device features or overlay targets having device-scale features. In one embodiment, an AEI metrology tool includes a particle-based metrology tool such as, but not limited to, an electron-beam metrology tool or an ion beam metrology tool. It may be the case that AEI data generated on device features or overlay targets with device-scale features may provide a more accurate characterization of overlay errors of a current layer with respect to previous layers than ADI data, particularly when the device features are not clearly resolvable with an ADI metrology tool. However, particle-based AEI metrology tools may suffer from a lower throughput and lower sampling rate than ADI tools, which may reduce the throughput of the entire fabrication line. Further, substantial issues identified at this stage may not always be mitigated and may result in sample loss.

It is further recognized herein that incorporating overlay data from different fabrication stages and/or by different tools may introduce instabilities into a process control system that may negatively impact performance. For the purposes of the present disclosure, NZO may refer to differences between overlay data generated at different fabrication stages and/or by different tools. For example, NZO may refer to, but is not required to refer to, a difference between ADI overlay data and AEI overlay data.

Additional embodiments of the present disclosure are directed to reducing NZO by augmenting overlay data with additional measurements (e.g., flag measurements) that are sensitive to variations in a fabrication process and/or physical variations of previous layers. It is recognized herein that such variations may be root causes of NZO, particularly NZO associated with overlay measured at different fabrication stages. In this regard, augmenting the overlay data may mitigate NZO and provide increased performance.

Overlay measurements are typically designed to be sensitive to registration errors between layers, but insensitive to other process variations such as, but not limited to, layer thickness, feature height, or feature asymmetry that may result from deviations during process steps (e.g., an etch step, a chemical-mechanical planarization (CMP) step, or the like). In this regard, a robust overlay measurement at one stage may be minimally sensitive to process deviations that do not directly impact the overlay on the sample at the time of the measurement. However, these process deviations may impact the final fabricated features and thus the overlay measured at a later fabrication stage, which may lead to NZO at the later stage. Additional embodiments of the present disclosure are directed to augmenting overlay data with flag data sensitive to complementary process variations to provide robust overlay measurements at each fabrication stage and minimize NZO.

Additional embodiments of the present disclosure are directed to predicting NZO at one fabrication stage based on overlay data and flag data from a different fabrication stage. For example, a NZO predictor may accept ADI overlay data and ADI flag data as inputs and predict the NZO associated with subsequent AEI overlay data. For example, NZO prediction may be, but is not required to be, based on machine learning algorithms trained by actual or simulated data.

Further embodiments of the present disclosure are directed to a process control system providing adjustments to fabrication tool control parameters based on overlay data and flag data from one fabrication stage and predicted NZO. In this regard, actual metrology at multiple fabrication stages may be unnecessary to maintain overlay within a selected tolerance.

For example, overlay data and flag data may be measured using an optical ADI metrology tool after a development step and a NZO predictor may predict any differences between the measured ADI overlay the actual overlay that could be measured using an AEI metrology tool after an etch step. It is recognized herein that NZO prediction may provide multiple advantages to process control. For example, NZO prediction may provide accurate overlay predictions of a fully fabricated layer based on ADI data. This may in turn reduce or eliminate the need for low-throughput overlay metrology tools (e.g., particle-based metrology tools commonly used for AEI). For instance, ADI data may be generated for all lots due to the relatively high throughput measurements, whereas AEI data may typically be generated for a smaller subset of samples or lots. A process control system may thus typically provide higher-frequency control with ADI data relative to AEI data. Further, ADI measurements facilitate lot dispositioning in response to identified issues prior to a non-reversible etch step.

Additional flag data may be generated at any stage of the fabrication process. For example, a high-throughput metrology tool (e.g., an optical metrology tool) may be used to generate flag data after an etch step (e.g., AEI flag data) to further augment ADI overlay data. For example, the AEI flag data may be used to train a NZO predictor or to directly augment ADI overlay data. This AEI flag data may be generated once the etch step is completed on the current layer or through a feedforward loop using data from samples on a previous lot.

Referring now to FIGS. 1A through 8, systems and methods for process control with NZO mitigation are described.

FIG. 1A is a conceptual view illustrating a semiconductor device system 100, in accordance with one or more embodiments of the present disclosure. In one embodiment, the system 100 includes including a lithography sub-system 102 for lithographically printing one or more patterns (e.g. device features, overlay target features, or the like) to a sample, in accordance with one or more embodiments of the present disclosure. The lithography sub-system 102 may include any lithographic printing tool known in the art. For example, the lithography sub-system 102 may include, but is not limited to, a scanner or stepper. In another embodiment, the system 100 includes a metrology sub-system 104 to characterize one or more printed patterns on the sample. For example, the metrology sub-system 104 may measure any metrology metric (e.g. overlay error, CD, sidewall angle, or the like) using any method known in the art. In one embodiment, the metrology sub-system 104 includes an image-based metrology tool to measure metrology data based on the generation of one or more images of the sample 122. In another embodiment, the metrology sub-system 104 includes a scatterometry-based metrology system to measure metrology data based on the scattering (reflection, diffraction, diffuse scattering, or the like) of light from the sample.

The system 100 may further include more than one lithography sub-system 102. For example, different layers may be exposed by different lithography sub-systems. By way of another example, a single layer may be exposed to different exposures by multiple lithography sub-systems. Similarly, the system 100 may further include more than one metrology sub-system 104. For example, the system 100 may include one or more optical metrology tools and one or more particle-based metrology tools (e.g., scanning electron microscopes, or the like) for providing metrology measurements at any fabrication stage.

In another embodiment, the system 100 includes a controller 106. In another embodiment, the controller 106 includes one or more processors 108 configured to execute program instructions maintained on a memory medium 110.

In this regard, the one or more processors 108 of controller 106 may execute any of the various process steps described throughout the present disclosure.

The one or more processors 108 of a controller 106 may include any processing element known in the art. In this sense, the one or more processors 108 may include any microprocessor-type device configured to execute algorithms and/or instructions. In one embodiment, the one or more processors 108 may consist of a desktop computer, mainframe computer system, workstation, image computer, parallel processor, or any other computer system (e.g., networked computer) configured to execute a program configured to operate the system 100, as described throughout the present disclosure. It is further recognized that the term "processor" may be broadly defined to encompass any device having one or more processing elements, which execute program instructions from a non-transitory memory medium 110. Further, the steps described throughout the present disclosure may be carried out by a single controller 106 or, alternatively, multiple controllers. Additionally, the controller 106 may include one or more controllers housed in a common housing or within multiple housings. In this way, any controller or combination of controllers may be separately packaged as a module suitable for integration into system 100.

The memory medium 110 may include any storage medium known in the art suitable for storing program instructions executable by the associated one or more processors 108. For example, the memory medium 110 may include a non-transitory memory medium. By way of another example, the memory medium 110 may include, but is not limited to, a read-only memory, a random access memory, a magnetic or optical memory device (e.g., disk), a magnetic tape, a solid state drive, and the like. It is further noted that memory medium 110 may be housed in a common controller housing with the one or more processors 108. In one embodiment, the memory medium 110 may be located remotely with respect to the physical location of the one or more processors 108 and controller 106. For instance, the one or more processors 108 of controller 106 may access a remote memory (e.g., server), accessible through a network (e.g., internet, intranet, and the like). Therefore, the above description should not be interpreted as a limitation on the present invention but merely an illustration.

Figure 1B:
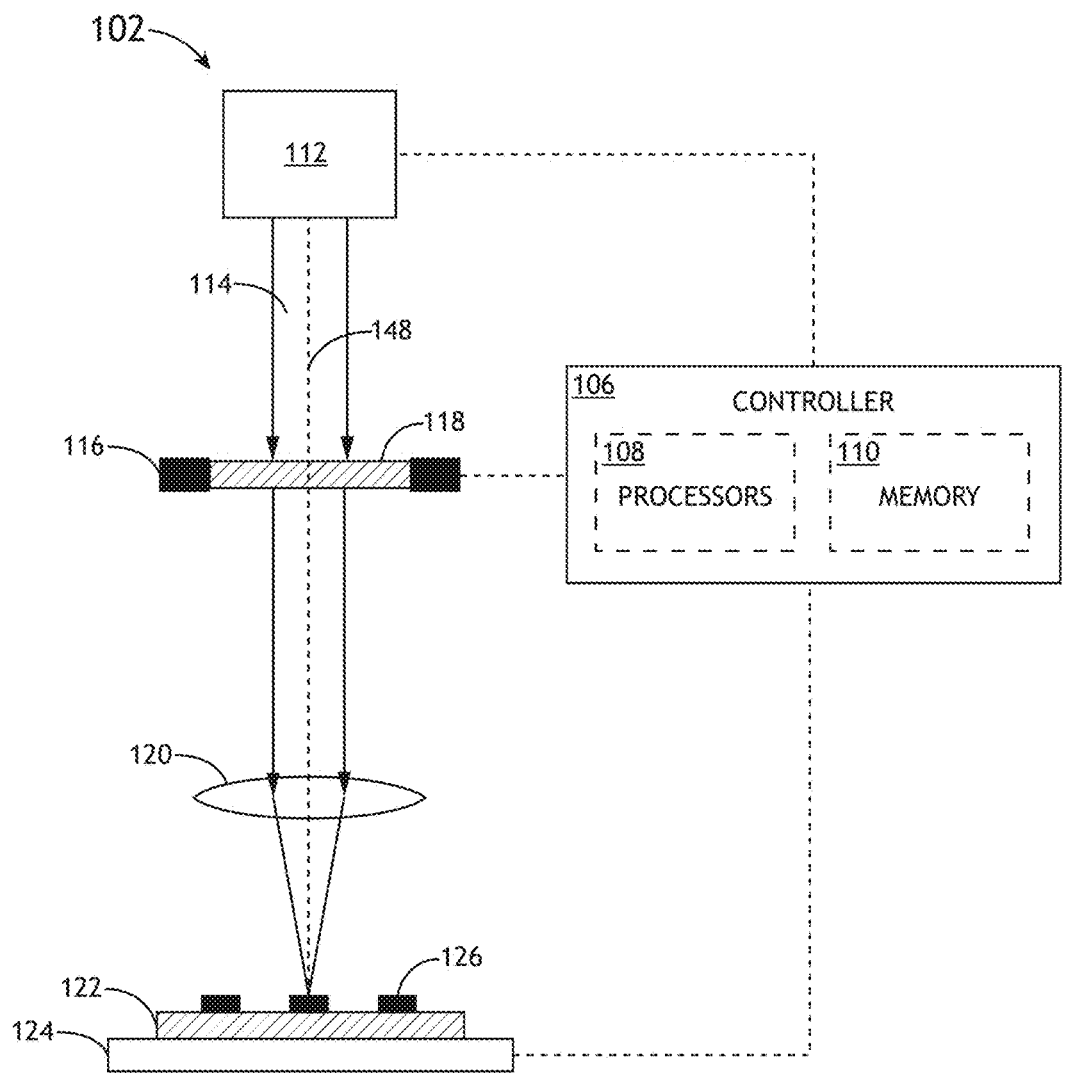
FIG. 1B is a conceptual view illustrating a lithography sub-system, in accordance with one or more embodiments of the present disclosure.

FIG. 1B is a conceptual view illustrating the lithography sub-system 102, in accordance with one or more embodiments of the present disclosure. In one embodiment, the lithography sub-system 102 includes an illumination source 112 configured to generate one or more illumination beams 114. The one or more illumination beams 114 may include one or more selected wavelengths of light including, but not limited to, ultraviolet (UV) radiation, visible radiation, or infrared (IR) radiation. In another embodiment, the illumination source 112 may generate one or more illumination beams 114 having any pattern known in the art. For example, the illumination source 112 may include, but is not limited to, a single-pole illumination source, a dipole illumination source, a C-Quad illumination source, a Quasar illumination source, or a free-form illumination source.

In another embodiment, the lithography sub-system 102 includes a mask support device 116. The mask support device 116 is configured to secure a pattern mask 118. In another embodiment, the lithography sub-system 102 includes a set of projection optics 120 configured to project an image of the pattern mask 118 illuminated by the one or more illumination beams 114 onto the surface of a sample 122 disposed on a sample stage 124. For example, the set of projection optics 120 may be configured to project an image of the pattern mask 118 onto a resist layer 126 on the sample 122 to generate (e.g. expose, or the like) a printed pattern element (e.g. a metrology pattern) on the resist layer 126 corresponding to a pattern element on the pattern mask 118. In another embodiment, the mask support device 116 may be configured to actuate or position the pattern mask 118. For example, the mask support device 116 may actuate the pattern mask 118 to a selected position with respect to the projection optics 120 of the system 100.

The pattern mask 118 may be utilized (e.g. by lithography sub-system 102) in any imaging configuration known in the art. For example, the pattern mask 118 may be a positive mask (e.g. a bright-field mask) in which pattern elements are positively imaged as printed pattern elements of a resist layer 126 of sample 122. By way of another example, the pattern mask 118 may be a negative mask (e.g. a dark-field mask) in which pattern elements of the pattern mask 118 form negative printed pattern elements (e.g. gaps, spaces, or the like) of a resist layer 126 of sample 122.

Figure 1C:
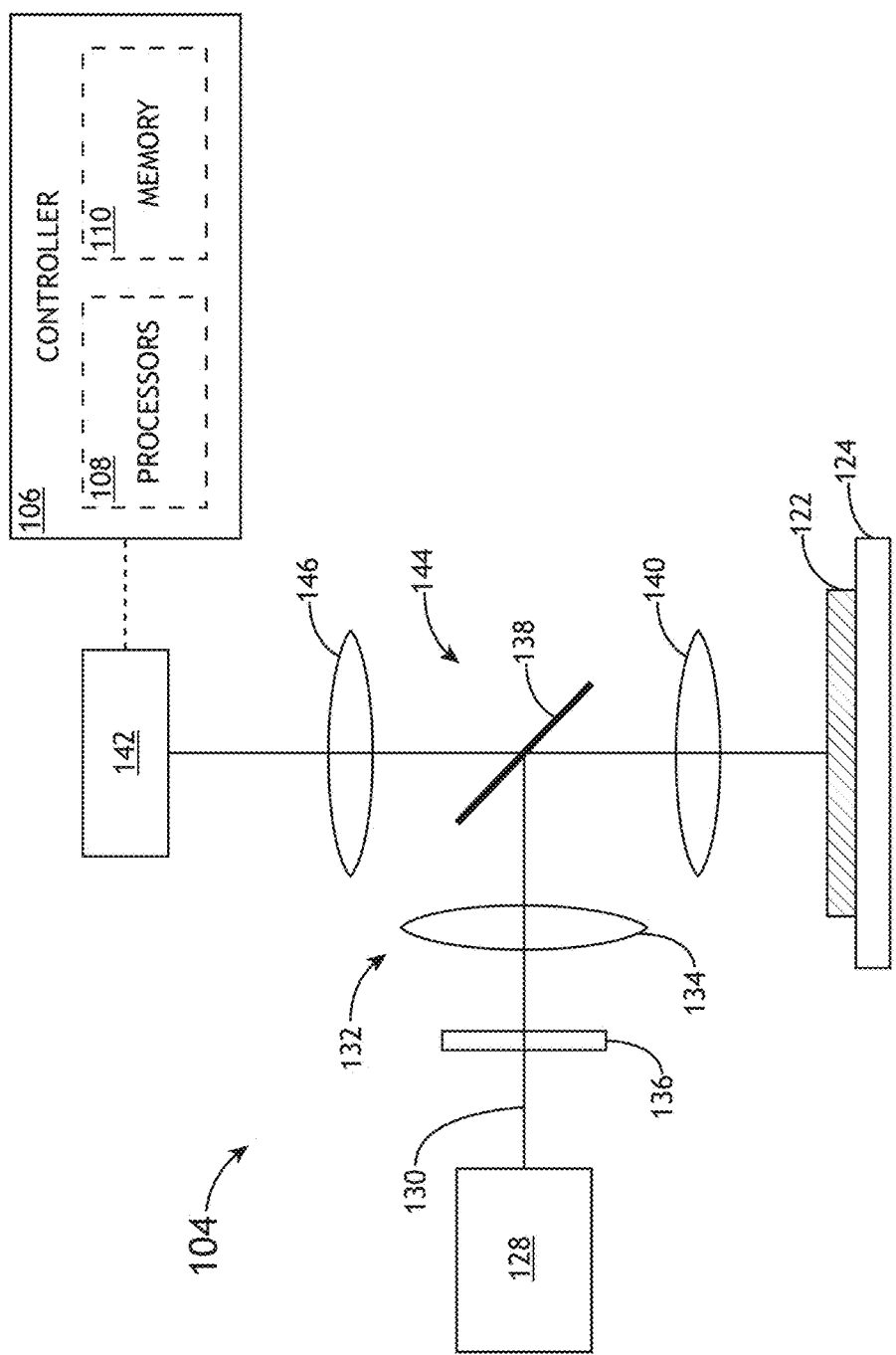
FIG. 1C is a conceptual view illustrating a metrology sub-system, in accordance with one or more embodiments of the present disclosure.

FIG. 1C is a conceptual view illustrating the metrology sub-system 104, in accordance with one or more embodiments of the present disclosure. For example, FIG. 1C may represent, but is not limited to representing, an optical metrology tool.

In one embodiment, the metrology sub-system 104 includes a metrology illumination source 128 to generate a metrology illumination beam 130. In another embodiment, the metrology illumination source 128 is the same as the illumination source 112. In a further embodiment, the metrology illumination source 128 is a separate illumination source configured to generate a separate metrology illumination beam 130. The metrology illumination beam 130 may include beam of electromagnetic radiation or a particle beam. For example, the metrology illumination beam 130 may include one or more selected wavelengths of electromagnetic radiation including, but not limited to, X-ray radiation, ultraviolet (UV) radiation, visible radiation, or infrared (IR) radiation. By way of another example, the metrology illumination beam 130 may include a beam of electrons, ions, neutral particles, or the like.

In another embodiment, the metrology illumination source 128 directs the metrology illumination beam 130 to the sample 122 via an illumination pathway 132. The illumination pathway 132 may include one or more illumination pathway lenses 134. Further, the illumination pathway 132 may include one or more additional optical components 136 suitable for modifying and/or conditioning the metrology illumination beam 130. For example, the one or more optical components 136 may include, but are not limited to, one or more polarizers, one or more filters, one or more beam splitters, one or more diffusers, one or more homogenizers, one or more apodizers, or one or more beam shapers.

In one embodiment, the illumination pathway 132 includes a beamsplitter 138. In another embodiment, the metrology sub-system 104 includes an objective lens 140 to focus the metrology illumination beam 130 onto the sample 122.

In another embodiment, the metrology sub-system 104 includes one or more detectors 142 configured to capture radiation emanating from the sample 122 through a collection pathway 144. The collection pathway 144 may include, but is not limited to, one or more collection pathway lenses 146 for collecting radiation from the sample 122. For example, a detector 142 may receive radiation reflected or scattered (e.g., via specular reflection, diffuse reflection, and the like) from the sample 122 via one or more collection pathway lenses 146. By way of another example, a detector 142 may receive radiation generated by the sample 122 (e.g., luminescence associated with absorption of the metrology illumination beam 130, or the like). By way of another example, a detector 142 may receive one or more diffracted orders of radiation from the sample 122 (e.g., 0-order diffraction, ±1 order diffraction, ±2 order diffraction, and the like).

The detector 142 may include any type of detector known in the art suitable for measuring radiation received from the sample 122. For example, a detector 142 may include, but is not limited to, a CCD detector, a TDI detector, a photomultiplier tube (PMT), an avalanche photodiode (APD), or the like. By way of another example, a detector 142 may include a spectroscopic detector suitable for identifying wavelengths of radiation emanating from the sample 122. By way of another example, a detector 142 may include a particle detector suitable for detecting particles (e.g., secondary electrons, backscattered electrons, or the like) emanating from the sample 122 in response to the metrology illumination beam 130. Further, the metrology sub-system 104 may include multiple detectors 142 (e.g. associated with multiple beam paths generated by one or more beamsplitters) to facilitate multiple metrology measurements by the metrology sub-system 104.

It is to be understood that the lenses of the metrology sub-system 104 (e.g., the illumination pathway lenses 134, the objective lens 140, the collection pathway lenses 146, or the like) may include any combination of components suitable for manipulating electromagnetic radiation and/or particle beams. For example, the metrology sub-system 104 may include refractive and/or diffractive lenses suitable for manipulating electromagnetic radiation. By way of another example, the metrology sub-system 104 may include electrostatic, magnetic, uni-potential, and/or double-potential lenses suitable for manipulating particle beams.

Figure 1D:
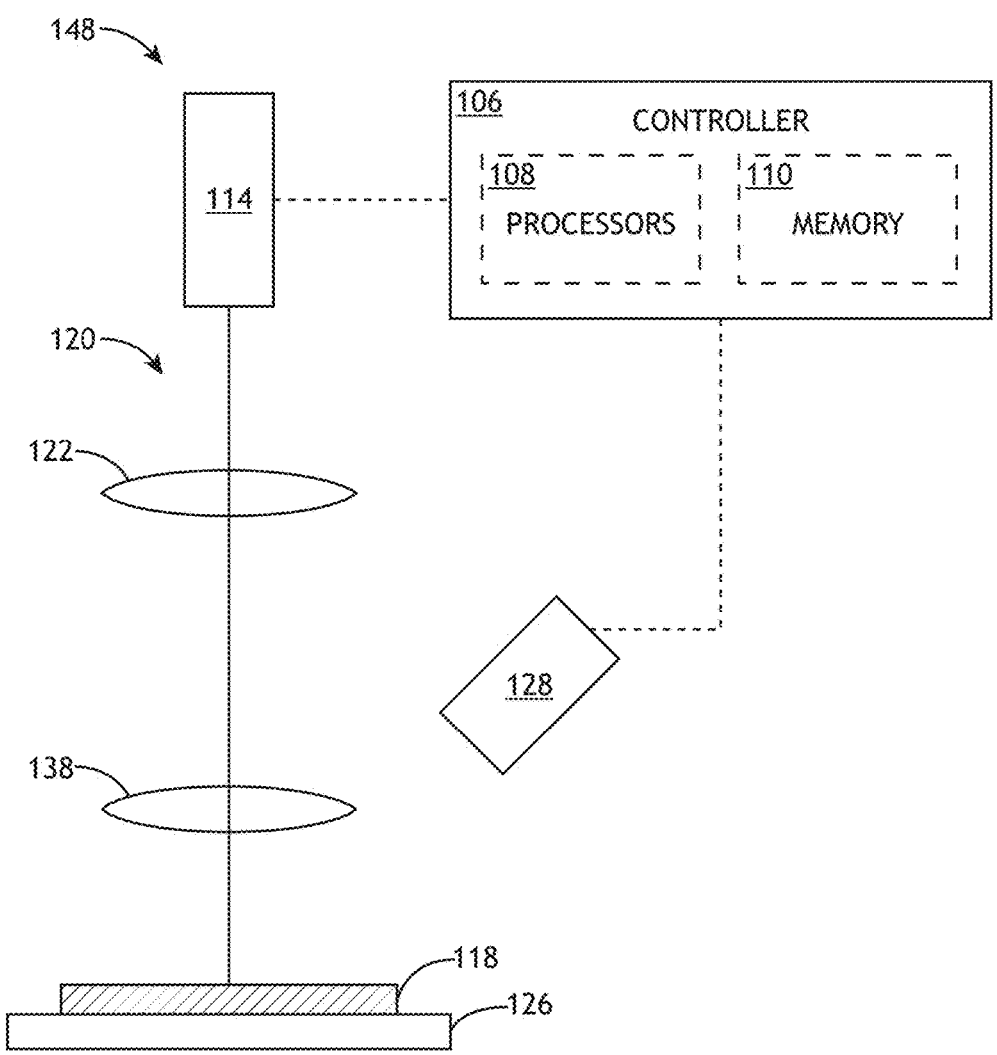
FIG. 1D is a conceptual view illustrating a metrology sub-system, in accordance with one or more embodiments of the present disclosure.

FIG. 1D is a conceptual view illustrating the metrology sub-system 104, in accordance with one or more embodiments of the present disclosure. For example, FIG. 1C may represent, but is not limited to representing, a column 148 of a particle-based metrology tool. The metrology sub-system 104 may include any number of columns 148.

In one embodiment, the illumination pathway 132 of the column 148 includes one or more particle focusing elements (e.g., illumination pathway lenses 134, or the like) arranged as a single focusing element or a compound focusing element. For example, the one or more particle focusing elements may include, but are not limited to, a single particle focusing element or one or more particle focusing elements forming a compound system suitable for directing the metrology illumination beam 130 to the sample 122. Further, a metrology sub-system 104 including multiple columns 148 may include a single metrology illumination source 128 for the columns 148 or a dedicated metrology illumination source 128 for one or more columns 148.

In another embodiment, the metrology sub-system 104 includes one or more offset detectors 142 to image or otherwise detect particles and/or electromagnetic radiation emanating from the sample 122. For example, the detector 142 may include an electron collector (e.g., a secondary electron collector, a backscattered electron detector, or the like). By way of another example, the detector 142 may include a photon detector (e.g., a photodetector, an X-ray detector, a scintillating element coupled to photomultiplier tube (PMT) detector, or the like) for detecting electrons and/or photons from the sample surface.

Figure 2:
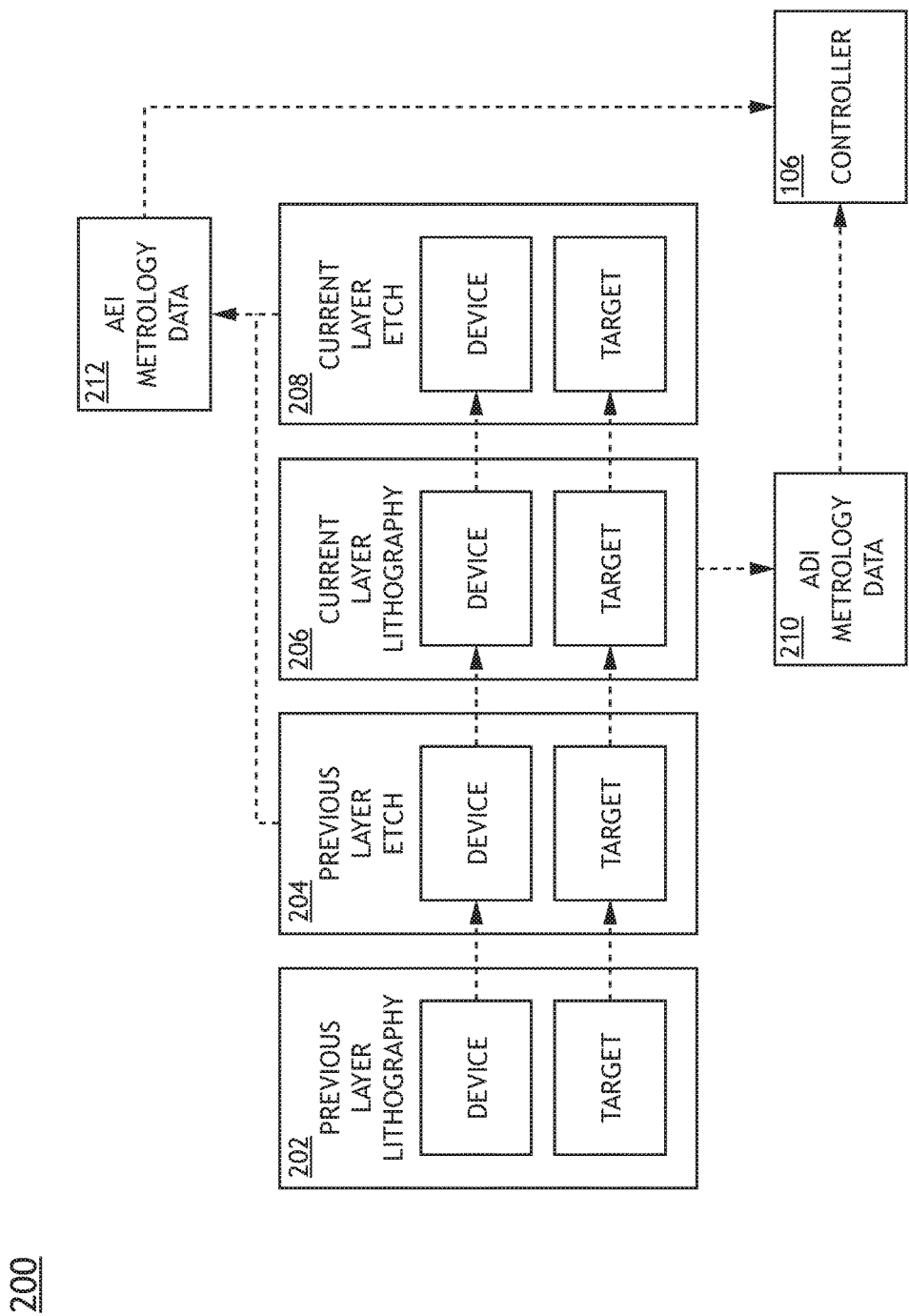
FIG. 2 is a flow diagram illustrating process control including ADI and AEI data collection for the fabrication control of a current layer, in accordance with one or more embodiments of the present disclosure.

FIG. 2 is a flow diagram 200 illustrating process control including ADI and AEI data collection for the fabrication control of a current layer, in accordance with one or more embodiments of the present disclosure. In one embodiment, sample layers include device elements that eventually form functional components of a fabricated device as well as target elements suitable for use as metrology targets (e.g., overlay targets, or the like). Further, in flow diagram 200, the fabrication of a sample layer is depicted through a lithography step and an etch step. It is to be understood that the depictions in flow diagram 200 are provided solely for illustrative purposes and should not be interpreted as limiting. For example, the fabrication of a sample layer may include additional steps not depicted in flow diagram 200 such as, but not limited to, material deposition, exposure, development, or CMP steps. By way of another example, the fabrication of a sample layer may include multiple iterations of lithography and etch steps (e.g., for double patterning, triple patterning, or the like).

A fabrication line may produce a multitude of identical samples in a production run. Further, the samples may be divided into lots. In one embodiment, each sample layer may be fabricated on all samples in the lot to fabricating a subsequent layer. For example, a previous layer lithography step 202 and a previous layer etch step 204 may be performed for all samples in the lot prior to a current layer lithography step 206 and a current layer etch step 208. The process may then repeat for subsequent lots.

A controller 106 (e.g., a process controller) may dynamically adjust control parameters of fabrication tools such as, but not limited to, the lithography sub-system 102 to maintain overlay between fabricated layers within a selected tolerance. The control parameters, or adjustments to the control parameters, may be generated based on metrology data generated at any stage in the fabrication process. In one embodiment, the controller 106 may receive ADI metrology data 210 from an ADI metrology tool (e.g., a metrology sub-system 104). For example, the ADI metrology data 210 may be generated from a metrology target as shown in flow diagram 200 and/or from device measurements (not shown). In another embodiment, the controller 106 may receive AEI overlay data 212 from an AEI metrology tool (e.g., an additional metrology sub-system 104). For example, the AEI overlay data 212 may be generated from device measurements as shown in flow diagram 200 and/or from metrology target measurements (not shown).

Further, metrology data (e.g., ADI metrology data 210 or AEI overlay data 212) may be provided as feedback and/or feedforward data. For example, fabrication tool control parameters for fabricating the current layer of a particular sample may be generated at least in part based on feedback metrology data (e.g., overlay data, or the like) from the current layer of previous samples in the current lot or previous lots. In this regard, the feedback data may be used to compensate for gradual drifts in the production process. By way of another example, fabrication tool control parameters for fabricating the current layer of a particular sample may be generated at least in part based on feedforward metrology data from the previous layer. In this regard, the feedforward data may compensate for sudden shifts associated with fabrication the previous layer.

The controller 106 may adjust fabrication tool control parameters at any frequency. For example, the controller 106 may receive ADI metrology data 210 from an optical ADI metrology tool multiple times per sample (e.g., after every die), after every one or more samples, or after one or more lots of samples. By way of another example, the controller 106 may receive AEI overlay data 212 from a particle-based AEI metrology tool one or more lots due to the low throughput relative to an optical metrology tool. Accordingly, the controller 106 may incorporate the AEI overlay data 212 into fabrication control parameter adjustments at a lower frequency than for ADI metrology data 210.

As previously described herein, it may be the case that overlay measurements based on ADI metrology data 210 may differ from overlay measurements based on AEI overlay data 212 and that the corresponding NZO may introduce instabilities into the control system. Accordingly, the values of the fabrication tool control parameters generated by the controller 106 may fluctuate. Further, it may be the case that the controller 106 may fail to maintain overlay between the current layer and previous layers within a selected tolerance.

Figure 3:
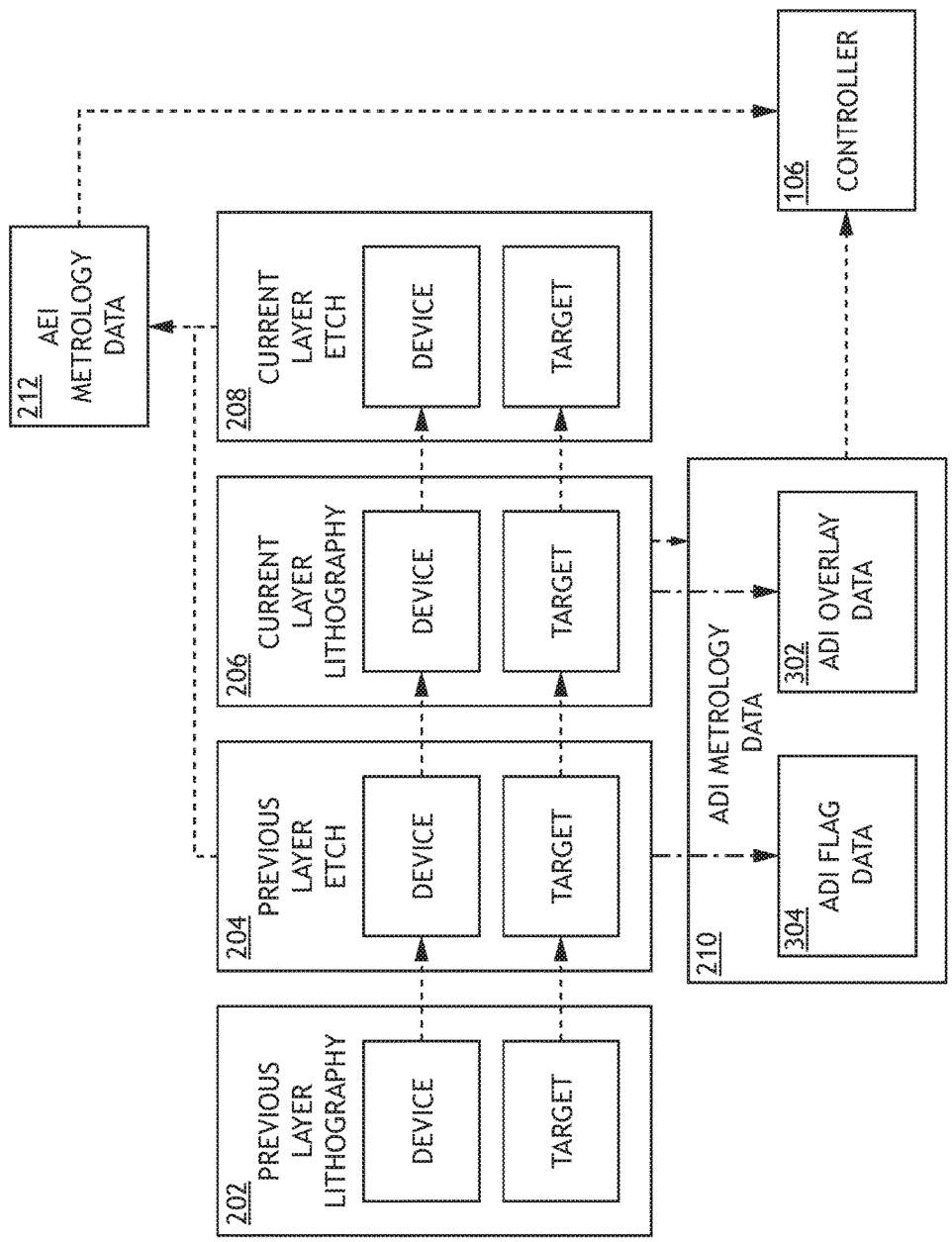
FIG. 3 is a flow diagram illustrating process control including process-sensitive ADI flag data to augment ADI and AEI data collection for the fabrication control of a current layer, in accordance with one or more embodiments of the present disclosure.

FIG. 3 is a flow diagram 300 illustrating process control incorporating process-sensitive ADI flag data to augment ADI and AEI data collection, in accordance with one or more embodiments of the present disclosure.

It is recognized herein that process variations in previous layers may be a significant root cause of NZO. As previously described herein, overlay measured using ADI after the current layer lithography step 206 may typically be designed to provide robust measurements based on exposed patterns that are relatively insensitive to process variations in previous layers such as but not limited to, thicknesses of one or more layers (e.g., the current layer or a previous layer), fabricated feature heights of structures on previous layers, or feature asymmetry on previous layers. However, these process variations in the previous layers may ultimately impact the overlay measured using AEI after fully fabricating the current layer and may thus lead to NZO when both ADI and AEI overlay measurements are incorporated into process control.

In one embodiment, ADI metrology data 210 generated after the current layer lithography step 206 includes both ADI overlay data 302 and ADI flag data 304. For example, the ADI overlay data 302 may include overlay measurements that are insensitive to process variations on previous layers, while the ADI flag data 304 may include measurements of device targets and/or metrology targets that are sensitive to the process variations of the previous layers. The ADI flag data 304 taken after the current layer lithography step 206 may thus be indicative of process variations present after the previous layer etch step 204. In this regard, the process-sensitive ADI flag data 304 may augment the process-insensitive ADI overlay data 302 to reduce or in some cases eliminate the NZO. For instance, the controller 106 may generate fabrication tool control parameters for the current layer that compensate for the process deviations in the previous layer captured by the ADI flag data 304.

The ADI flag data 304 may be generated using multiple techniques. In one embodiment, ADI flag data 304 may be generated by analyzing one or more aspects of metrology targets (e.g., an imaging overlay target, or the like) distributed across a sample. Metrology targets may be categorized and/or ranked based on target metrics (e.g., flags). For example, an image of a periodic metrology structure (e.g., such as those found on AIM targets, or the like) may be decomposed into a kernel having three components: a periodic component, a linear trend component, and a random noise component. Accordingly, flags may be used to describe various aspects of the image such as, but not limited to, the strength of the periodic signal, the strength of the linear components, the strength of the noise components (e.g., a noise region of interest flag), a ratio of the periodic signal strength to a noise component (e.g., a periodic ratio flag), the contrast (e.g., a contrast precision flag), one or more quality metrics (e.g., a Q-merit flag), through-focus-overlay, or the like. Further, the image may be divided into multiple regions of interest such that flags may be generated for each region of interest or relating multiple regions of interest. For instance, a kernel 3-sigma flag may provide a measure of the symmetry of the periodic structure by comparing the centers of symmetry for multiple regions of interest within the periodic structure. In another embodiment, ADI flag data 304 may be generated by analyzing the distribution of radiation received from the sample (e.g., in a scatterometry-based metrology system). For example, flags may be used to describe various aspects of a pupil-plane distribution such as, but not limited to, symmetry of the pupil signal, flatness of the pupil signal (e.g., indicative of robustness of a received signal), variance of a calculated overlay across the pupil (e.g., a pupil 3-sigma flag), the presence of arcs (e.g., resonances, or the like) within the pupil signal (e.g., a pupil R flag, rule-based inspection (RBI) flags, or the like), or a sensitivity of the target to overlay variations.

It is to be understood, however, that the above descriptions of flag data are provided solely for illustrative purposes and should not be interpreted as limiting. The use of flag data is generally described in PCT Application No. PCT/US17/57767 titled "Utilizing Overlay Misregistration Error Estimations in Imaging Overlay Metrology" and filed on Oct. 22, 2017, which is incorporated by reference herein in its entirety. Further, ADI flag data 304 may include any data associated with a metrology measurement that is indicative of process variations relevant to NZO.

In one embodiment, ADI flag data 304 is generated using dedicated process-sensitive metrology targets. For example, process-sensitive metrology targets may include features for which one or more physical attributes (e.g., location on the sample, sidewall angle, or the like) is influenced by process variations with a known relationship. In this regard, the ADI flag data 304 may include metrology measurements of the physical attributes. By way of another example, process-sensitive metrology targets may include features that mimic an overlay target such that an overlay metrology tool may generate an overlay metric that is influenced by process variations with a known relationship. In this regard, the ADI flag data 304 may include the overlay metric. In another embodiment, ADI flag data 304 is generated using actual overlay targets that are sensitive to the process variations of interest. In this regard, the ADI flag data 304 may include measured process-sensitive overlay values.

Further, the ADI flag data 304 may be generated based on features in any layer. For example, measurement of process-sensitive metrology targets with features on the previous layer may provide information pertaining to the fabrication of the previous layer that may be a root cause of NZO. For some target designs such as, but not limited to, imaging-based targets, features on previous layers may be visible during ADI metrology after the current layer lithography step 206. For instance, features on previous layers may be visible through a transparent portion of the current layer or through a gap in the current layer. In this regard, the ADI flag data 304 generated after the current layer lithography step 206 may provide isolated information regarding process variations during the fabrication of the previous layer. For some target designs such as, but not limited to, grating-over-grating targets for scatterometry analysis, developed features in the current layer may overlap features of the previous layer. In this regard, process variations during the fabrication of the previous layer may be coupled to features within the current layer.

The ADI flag data 304 may additionally include any parameter measurable using an ADI metrology tool. For example, ADI flag data 304 may include shape overlay data, alignment inaccuracy data (e.g., an alignment mark asymmetry metric), or the like.

In another embodiment, ADI flag data 304 is generated using selected portions of overlay targets suitable for ADI overlay measurement. For example, a metrology target may include multiple cells in which some cells are designed to be insensitive to process variations (e.g., suitable for the generation of ADI overlay data 302) and in which some cells are designed to be sensitive to process variations (e.g., suitable for the generation of ADI flag data 304).

The ADI overlay data 302 and the ADI flag data 304 may be generated using any sampling scheme known in the art. For example, ADI overlay data 302 and the ADI flag data 304 may be generated at selected locations across a sample to provide a representative dataset. Further, a sampling model may be used to extrapolate values of ADI metrology data 210 and AEI overlay data 212 to all locations. In this regard, sampling schemes may be developed to provide a desired level of data accuracy while maintaining a desired sampling throughput.

The ADI overlay data 302 and the ADI flag data 304 may be generated using any number of measurement recipes describing measurement parameters. For example, a measurement recipe may include the locations on the sample at which metrology measurements should be performed. Further, a measurement recipe may include, but is not limited to, an illumination wavelength, a wavelength of radiation emanating from the sample suitable for detection, a spot size of illumination on the sample, an angle of incident illumination, a polarization of incident illumination, a position of a beam of incident illumination on an overlay target, a position of an overlay target in the focal volume of the overlay metrology tool, or the like. Accordingly, an overlay recipe may include a set of measurement parameters for generating an overlay signal suitable for determining overlay of two or more sample layers.

In one embodiment, ADI overlay data 302 and the ADI flag data 304 are generated using a common measurement recipe. In this regard, the ADI overlay data 302 and the ADI flag data 304 may be generated based on measurements of difference cells of common metrology targets. In another embodiment, ADI overlay data 302 and the ADI flag data 304 are generated using a composite measurement recipe in which the measurement locations for ADI overlay data 302 and ADI flag data 304 are separately defined. For example, the ADI flag data 304 may be, but is not required to be, generated at fewer locations than the ADI overlay data 302. In this regard, the impact of the additional flag measurements may be limited.

Referring now to FIGS. 4 through 7, process control using NZO prediction is described. In some embodiments, the system 100 includes a NZO predictor 402 suitable for predicting NZO between overlay generated at different fabrication stages based on metrology data from a single fabrication stage.

In one embodiment, NZO predictor 402 includes one or more processors configured to execute program instructions maintained on a memory medium. Further, the NZO predictor 402 may be integrated within or be separate from the controller 106. In one embodiment, the controller 106 includes the NZO predictor 402. In another embodiment, the NZO predictor 402 and the controller 106 may be communicatively coupled controllers, each having separate processors and/or memory.

Figure 4:
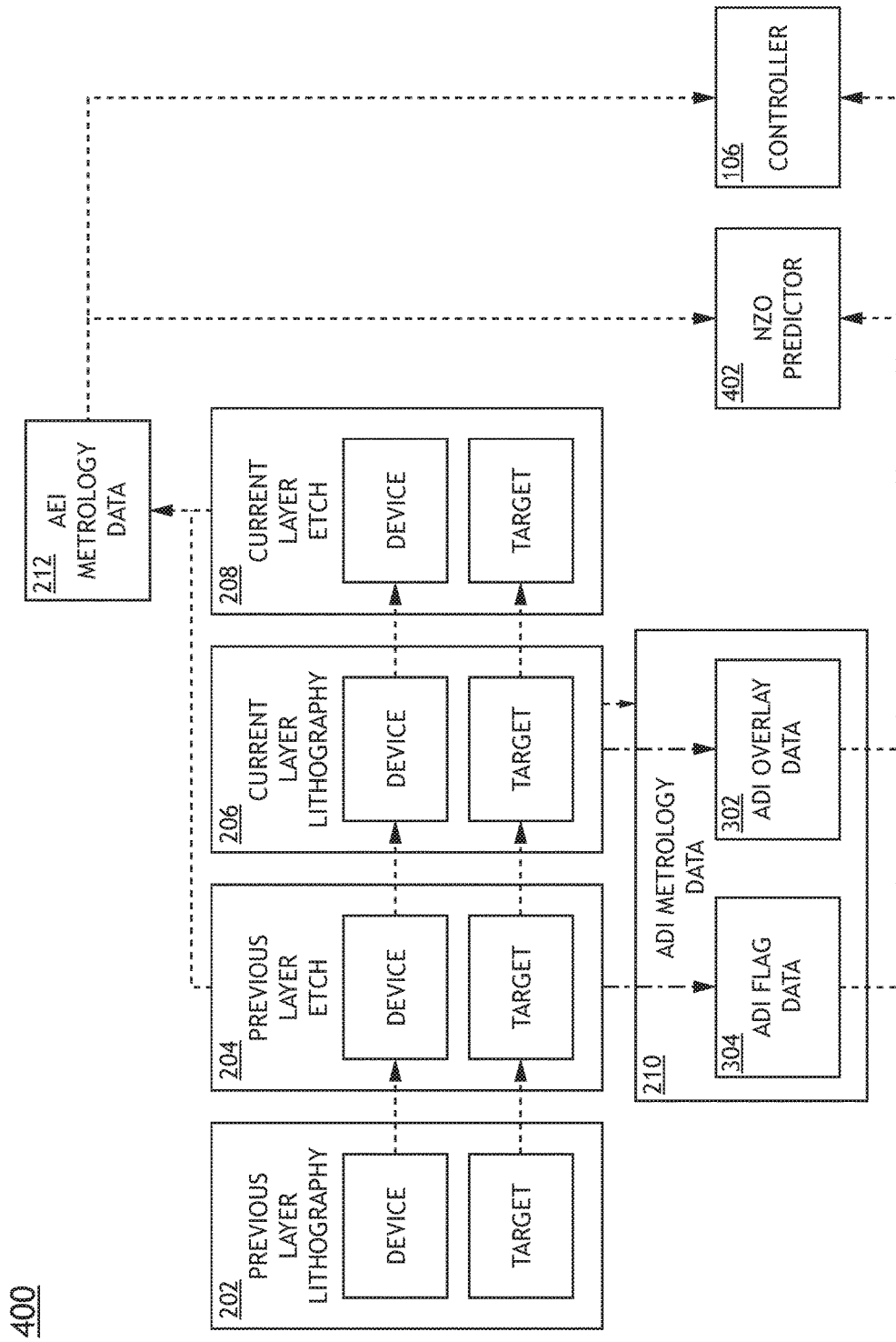
FIG. 4 is a flow diagram illustrating a training phase for a NZO predictor utilizing ADI flag data, ADI overlay data and AEI overlay data for the fabrication control of a current layer, in accordance with one or more embodiments of the present disclosure.

FIG. 4 is a flow diagram 400 illustrating a training phase for a NZO predictor 402 utilizing ADI flag data, ADI overlay data and AEI overlay data for the fabrication control of a current layer, in accordance with one or more embodiments of the present disclosure.

In one embodiment, the NZO predictor 402 predicts NZO between overlay generated at different fabrication stages based on metrology data from a single fabrication stage using machine learning algorithms. The NZO predictor 402 may utilize any machine learning algorithm known in the art suitable for predicting NZO such as, but not limited to, neural networks, deep generative modeling, principal component analysis, signal response metrology, or the like.

In one embodiment, the NZO predictor 402 may be trained to predict NZO based on machine learning algorithms by providing ADI metrology data 210 (including both ADI overlay data 302 and ADI flag data 304) as input training data and AEI overlay data 212 as output training data. The NZO predictor 402 may then analyze the data and identify one or more patterns that may link (e.g., with an estimated probability) characteristics observable in the input training data to characteristics of the output training data. In this regard, the NZO predictor 402 may identify patterns in the ADI overlay data 302 and ADI flag data 304 sufficient to predict the NZO.

Figure 5:
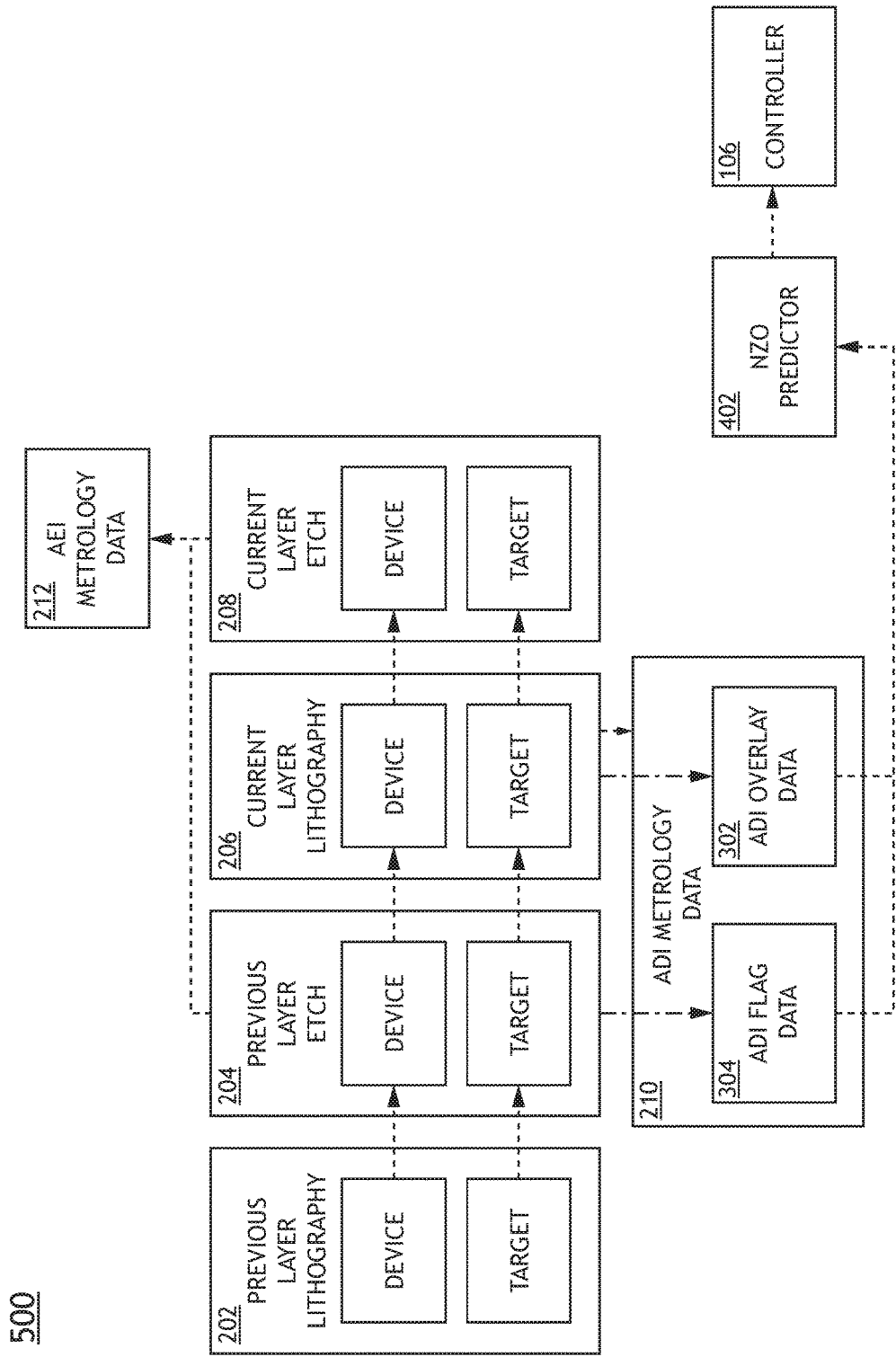
FIG. 5 is a flow diagram illustrating a runtime phase of a process controller utilizing ADI flag data, ADI overlay data and output from a NZO predictor for the fabrication control of a current layer, in accordance with one or more embodiments of the present disclosure.

FIG. 5 is a flow diagram 500 illustrating a runtime phase of a process controller utilizing ADI flag data, ADI overlay data, and output from a NZO predictor 402 for the fabrication control of a current layer, in accordance with one or more embodiments of the present disclosure.

After the training phase depicted in flow diagram 400, the controller 106 may provide adjustments to fabrication tool control parameters based solely on ADI metrology data 210 generated after the current layer lithography step 206. For example, the ADI overlay data 302 and the ADI flag data 304 may be provided as inputs to the NZO predictor 402, which may generate a predicted NZO associated with a predicted AEI overlay measurement after the current layer etch step 208.

Accordingly, the controller 106 may generate corrections to the fabrication tool control parameters on the same timescale as the ADI measurements. For example, an optical ADI metrology tool may be placed in close temporal and spatial proximity to a lithography tool to provide rapid metrology measurements with limited throughput impact. For example, an optical ADI metrology tool may provide multiple measurements on a given sample, or measurements on selected samples.

Further, the combined use of ADI flag data 304 and the NZO predictor 402 may facilitate accurate estimations of the actual overlay. For example, ADI flag data 304 and the NZO predictor 402 may facilitate accurate estimations of overlay that would be measured by a high-resolution AEI metrology tool after the current layer etch step 208 without requiring actual measurement of the sample with the AEI metrology tool. Providing metrology data from a single source at a single fabrication step (e.g., ADI after the current layer lithography step 206) additionally eliminates actual NZO and thus mitigates NZO-induced instabilities.

The training phase depicted in flow diagram 400 and the runtime phase depicted in flow diagram 500 may be implemented in sequence or simultaneously. In one embodiment, the training phase is performed on one or more training samples prior to runtime. For example, the NZO predictor 402 may be trained with one or more process excursion samples designed to provide a systematically-varying series of processing variations (e.g., varying film thickness, varying feature height, CMP splits, etch splits, lithographic focus and/or dose splits, optical dispersion splits, film composition variations, or the like). In this regard, the NZO predictor 402 may determine the independent impact of each process variation as well as the impact of multiple simultaneous process variations.

In another embodiment, the training phase is performed simultaneously with the run-time phase. For example, at the beginning of a production run or a lot run, the system 100 may implement an AEI metrology tool to generate AEI overlay data 212 to be fed into both the NZO predictor 402 for training and the controller 106 for the control of fabrication tool control parameters. In this regard, the overlay based on AEI overlay data 212 and the predicted NZO from the NZO predictor 402 may be compared. The use of the AEI overlay data 212 may then be phased out and potentially eliminated as the accuracy of the NZO predictions increase.

Figure 6:
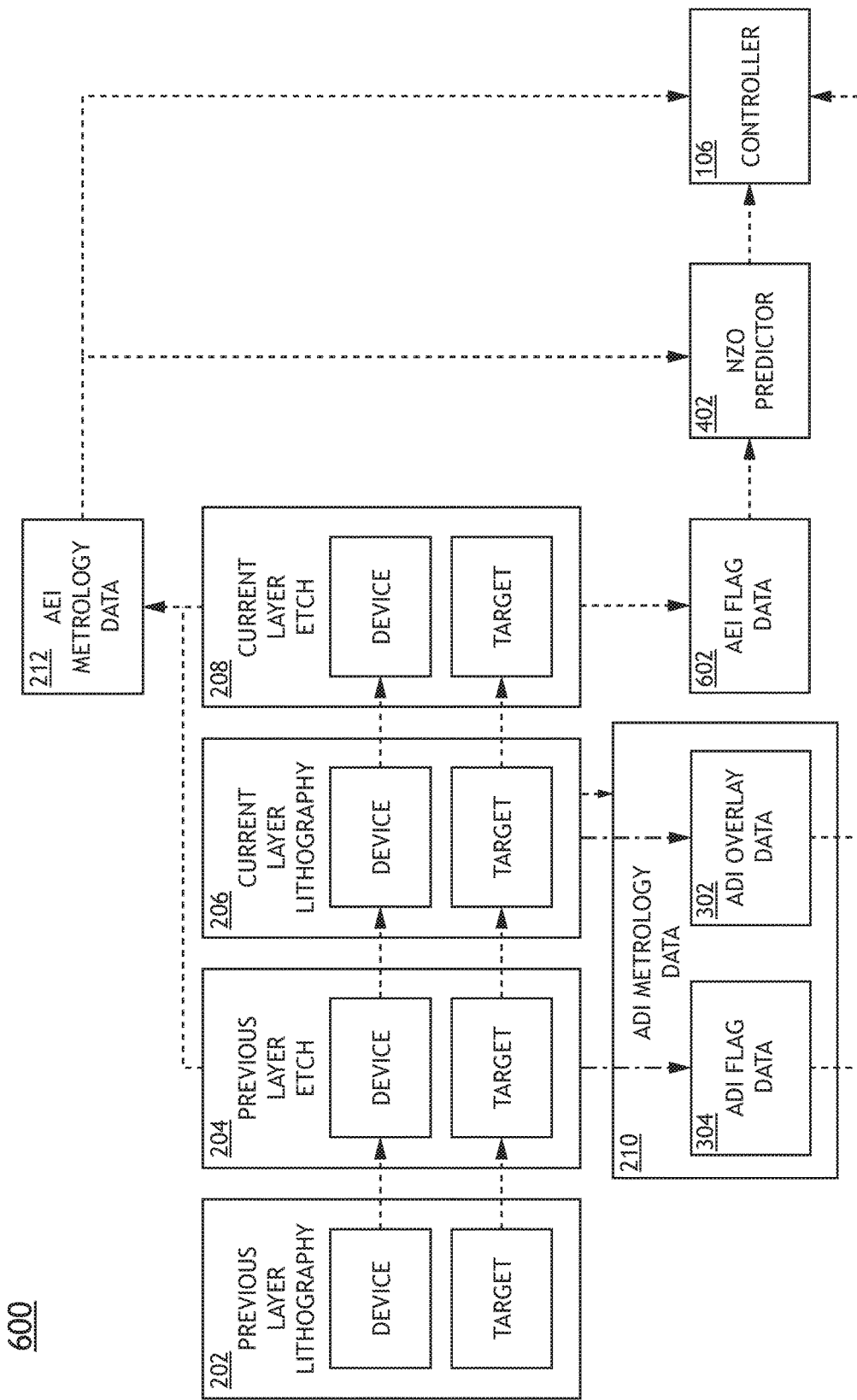
FIG. 6 is a flow diagram illustrating a training phase for a NZO predictor utilizing ADI flag data, ADI overlay data, AEI flag data, and AEI overlay data for the fabrication control of a current layer, in accordance with one or more embodiments of the present disclosure.
Figure 7:
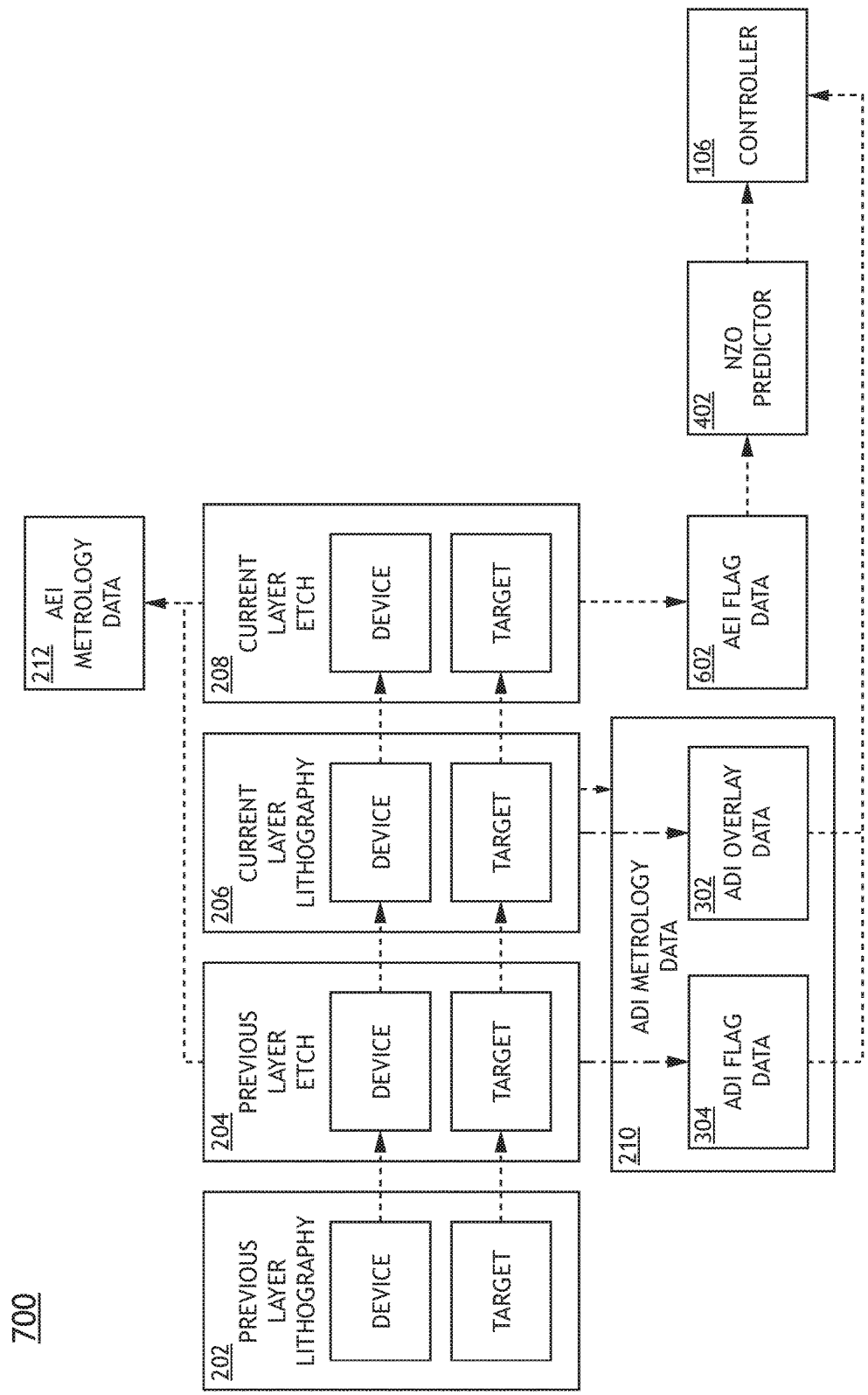
FIG. 7 is a flow diagram illustrating a runtime phase of a process controller utilizing ADI flag data, ADI overlay data, AEI flag data, and output from a NZO predictor for the fabrication control of a current layer, in accordance with one or more embodiments of the present disclosure.

Referring now to FIGS. 6 and 7, the controller 106 may utilize process-sensitive flag data generated after the current layer etch step 208 (e.g., AEI Flag Data 602). For example, AEI Flag Data 602 may be generated by an optical metrology (e.g., a version of metrology sub-system 104) tool to provide high throughput measurements.

FIG. 6 is a flow diagram 600 illustrating a training phase for a NZO predictor 402 utilizing ADI flag data, ADI overlay data, AEI flag data, and AEI overlay data for the fabrication control of a current layer, in accordance with one or more embodiments of the present disclosure. FIG. 7 is a flow diagram 700 illustrating a runtime phase of a process controller utilizing ADI flag data, ADI overlay data, AEI flag data, and output from a NZO predictor 402 for the fabrication control of a current layer, in accordance with one or more embodiments of the present disclosure.

The incorporation of AEI Flag Data 602 may further facilitate the prediction of NZO by providing overlay data after the current layer etch step 208 that incorporates process variations of the current layer that may contribute to NZO.

In one embodiment, the AEI Flag Data 602 is generated after the current layer etch step 208 for each sample. The controller 106 may then generate adjustments to fabrication tool control parameters for subsequent once available. It is recognized herein that AEI Flag Data 602 generated using an optical metrology tool may provide increased throughput and thus a higher frequency control loop relative to AEI overlay data 212 generated using a particle-based metrology tool.

In another embodiment, ADI flag data from a previous lot is provided (e.g., as feedforward data) as a substitute for AEI Flag Data 602 in the current lot. As described previously herein, ADI flag data measured after a lithography step of a current layer may be sensitive to process variations in the previous layer and may thus provide information that could otherwise be obtained using AEI after a previous layer etch step. In this regard, ADI flag data from a previous lot may provide a substitute for AEI Flag Data 602 in the current lot. It is recognized that this approach may not be limited by wait time associated with separate AEI measurements and may thus provide a high-frequency control loop based solely on ADI data.

In another embodiment, multilayer overlay targets are fabricated on a sample to facilitate the generation of feedforward ADI data. Suitable multilayer overlay targets may include, but are not limited to, AIM targets having three or more layers. For example, consider a fabrication process including m layers $l_i$, i=1 . . . m. In this example, AEI Flag Data 602 for a current layer $l_n$ in a current lot may be substituted with ADI flag data for layer $l_{n+1}$ in a previous lot.

Further, the controller 106 may utilize any ADI measurements as feedback and/or feedforward data to provide adjustments to fabrication tool control parameters. For example, shape overlay data may be provided as feedforward or feedback data during either a training phase or a run-time phase to provide sample to sample control based on grouping within lots according to shape parameters. By way of another example, alignment inaccuracy data (e.g., associated with an alignment mark asymmetry metric) may be provided as feedback or feedforward data during either a training phase or a run-time phase.

Figure 8:
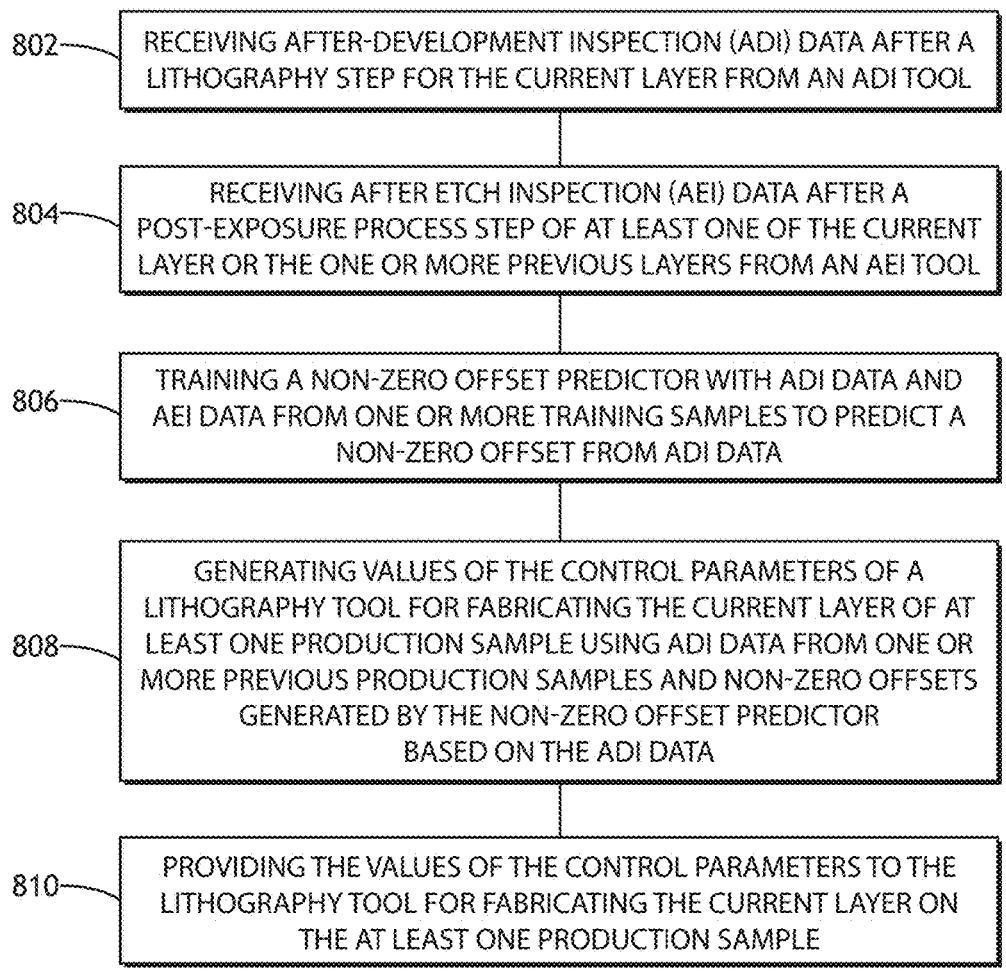
FIG. 8 is a flow diagram illustrating steps performed in a process control method, in accordance with one or more embodiments of the present disclosure.

FIG. 8 is a flow diagram illustrating steps performed in a process control method 800, in accordance with one or more embodiments of the present disclosure. Applicant notes that the embodiments and enabling technologies described previously herein in the context of system 100 should be interpreted to extend to method 800. It is further noted, however, that the method 800 is not limited to the architecture of system 100.

In one embodiment, the method 800 includes a step 802 of receiving after-development inspection (ADI) data after a lithography step for the current layer from an ADI tool. For example, the ADI data may be indicative of overlay errors between a current layer and one or more previous layers of semiconductor device being fabricated. Further, the ADI data may include ADI flag data indicative of process deviations during the fabrication of the one or more layers.

In one embodiment, ADI data is generated using a high-throughput metrology tool suitable for rapidly providing the ADI data to a process controller to facilitate a high-frequency control loop. For example, ADI data may be generated using an optical metrology tool such as, but not limited to, an image-based metrology tool or a scatterometry-based metrology tool.

In another embodiment, the method 800 includes a step 804 of receiving after etch inspection (AEI) overlay data after an exposure step of the current layer from an AEI tool. Further, a non-zero offset may correspond to a difference between overlay error determined from the ADI data and the AEI overlay data.

In one embodiment, AEI data is generated using a high accuracy metrology tool such as, but not limited to, a scanning electron metrology tool. In this regard, the AEI metrology tool may exhibit a higher resolution, but potentially lower throughput than the ADI metrology tool.

In another embodiment, the method 800 includes a step 806 of training a non-zero offset predictor with ADI data and AEI overlay data from one or more training samples to predict a non-zero offset from ADI data. It is recognized herein that a nonzero offset associated with a difference between overlay measured during ADI and AEI for a given layer may induce instabilities in a control system. Accordingly, a NZO predictor may accept arbitrary ADI data as an input and may provide a prediction of NZO (or alternately AEI data).

The step 806 may include training a NZO predictor using any type of machine learning algorithm known in the art such as, but not limited to, neural networks, deep generative modeling, principal component analysis, signal response metrology, or the like.

In another embodiment, the method 800 includes a step 808 of generating values of the control parameters of a lithography tool for fabricating the current layer of at least one production sample using ADI data from one or more previous production samples and non-zero offsets generated by the non-zero offset predictor based on the ADI data from the one or more previous production samples. The control parameters may thus maintain overlay error between the current layer and the one or more previous layers within a selected tolerance.

In one embodiment, the NZO predictor trained in step 806 operates in a run-time phase by accepting ADI inputs for a current layer and predicting NZO associated with overlay measurements using an AEI metrology tool. In this regard, actual AEI measurements may not be required. Accordingly, a process controller may update the control parameters for fabrication tools (e.g., a lithography tool) on the frequency of the ADI data acquisition.

In another embodiment, the method 800 includes a step 810 of providing the values of the control parameters to the lithography tool for fabricating the current layer on the at least one production sample. For example, the control parameters (or adjustments to the control parameters) may be transmitted to the lithography tool for the fabrication of the current layer.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A process control system, comprising:
a controller configured to communicatively couple to a lithography tool fabricating a current layer to provide control parameters to maintain overlay error between the current layer and one or more previous layers within a selected specification, the controller including one or more processors configured to execute program instructions configured to cause the one or more processors to:
receive after-development inspection (ADI) data after a lithography step for the current layer from an ADI tool, the ADI data including ADI overlay data indicative of overlay errors between the current layer and the one or more previous layers, the ADI data further including ADI flag data indicative of process deviations during fabrication of the one or more previous layers;
receive after etch inspection (AEI) overlay data after an exposure step of the current layer from an AEI tool, the AEI overlay data indicative of overlay errors between the current layer and the one or more previous layers, wherein a non-zero offset corresponds to a difference between overlay error determined from ADI data and AEI overlay data;
train a non-zero offset predictor with ADI data and AEI overlay data from one or more training samples to predict a non-zero offset from ADI data;
generate values of the control parameters of the lithography tool fabricating the current layer of at least one production sample using ADI data from one or more previous production samples and non-zero offsets generated by the non-zero offset predictor based on the ADI data from the one or more previous production samples; and
provide the values of the control parameters to the lithography tool for fabricating the current layer on the at least one production sample.

2. The process control system of claim 1, wherein the one or more processors are further configured to execute program instructions configured to cause the one or more processors to:
receive ADI flag data from one or more subsequent layers on at least one production sample in a previous lot, the one or more subsequent layers fabricated above the current layer in the previous lot; and
train the non-zero offset predictor with the ADI flag data from the one or more subsequent layers.

3. The process control system of claim 2, wherein generating the values of the control parameters of the lithography tool further comprises:
generating the values of the control parameters of the lithography tool based at least in part on non-zero offsets generated by the non-zero offset predictor based on the ADI flag data from the one or more subsequent layers on the at least one production sample in the previous lot.

4. The process control system of claim 1, wherein the ADI flag data of a metrology target is generated by analyzing one or more regions of interest of the metrology target based on a target metric.

5. The process control system of claim 4, wherein the metrology target includes a periodic structure, wherein the target metric comprises:
decomposing at least one of the one or more regions into a periodic component, a linear component, and a noise component.

6. The process control system of claim 5, wherein the target metric further comprises:
at least one of a strength of the periodic component, a ratio of the strength of the periodic component to a strength of the noise component.

7. The process control system of claim 4, wherein the metrology target includes a periodic structure, wherein the target metric comprises:
a measure of the symmetry of the one or more regions of interest.

8. The process control system of claim 1, wherein the ADI metrology tool has a higher throughput than the AEI metrology tool.

9. The process control system of claim 1, wherein the AEI metrology tool has a higher resolution than the ADI metrology tool.

10. The process control system of claim 1, wherein the ADI overlay data and the ADI flag data are generated using a composite metrology recipe.

11. The process control system of claim 10, wherein the composite recipe includes a first set of sampling locations for measuring the ADI overlay data and a second set of sampling locations for measuring the ADI flag data.

12. The process control system of claim 11, wherein the first set of sampling locations is larger than the second set of sampling locations.

13. The process control system of claim 1, wherein the ADI overlay data and the ADI flag data are generated on different metrology targets.

14. The process control system of claim 1, wherein the ADI overlay data and the ADI flag data are generated on different cells of common metrology targets.

15. The process control system of claim 1, wherein the ADI tool comprises:
an optical metrology tool.

16. The process control system of claim 1, wherein the AEI tool comprises:
a particle-beam metrology tool.

17. The process control system of claim 16, wherein the particle-beam metrology tool comprises:
at least one of an electron beam metrology tool or an ion-beam metrology tool.

18. A process control system, comprising:
a controller configured to communicatively couple to a lithography tool fabricating a current layer to provide control parameters to maintain overlay error between the current layer and one or more previous layers within a selected specification, the controller including one or more processors configured to execute program instructions configured to cause the one or more processors to:
receive after-development inspection (ADI) data after a lithography step for the current layer from an ADI tool, the ADI data including ADI overlay data indicative of overlay errors between the current layer and the one or more previous layers, the ADI data further including ADI flag data indicative of process deviations during fabrication of the one or more previous layers;
receive after etch inspection (AEI) overlay data after an exposure step of the current layer from an AEI tool, the AEI overlay data indicative of overlay errors between the current layer and the one or more previous layers, wherein a non-zero offset corresponds to a difference between overlay error determined from ADI data and AEI overlay data;
generate values of the control parameters of the lithography tool fabricating the current layer of at least one production sample using ADI data and AEI data from one or more previous production samples; and
provide the values of the control parameters to the lithography tool for fabricating the current layer on the at least one production sample.

19. The process control system of claim 18, wherein generating the values of the control parameters of the lithography tool fabricating the current layer of the at least one production sample using ADI data and AEI data from the one or more previous production samples comprises:
training a non-zero offset predictor with ADI data and AEI overlay data from one or more training samples to predict a non-zero offset from ADI data; and
generating the values of the control parameters based on ADI data from the one or more previous production samples and non-zero offsets generated by the non-zero offset predictor based on the ADI data from the one or more previous production samples.

20. The process control system of claim 18, wherein generating the values of the control parameters of the lithography tool fabricating the current layer of the at least one production sample using ADI data and AEI overlay data from the one or more previous production samples comprises:
updating the values of the control parameters based on the ADI data with a first frequency; and
updating the values of the control parameters based on the AEI overlay data with a second frequency lower than the first frequency.

21. The process control system of claim 18, wherein the one or more processors are further configured to execute program instructions configured to cause the one or more processors to:
receive ADI flag data from one or more subsequent layers on at least one production sample in a previous lot, the one or more subsequent layers fabricated above the current layer in the previous lot.

22. The process control system of claim 21, wherein generating the values of the control parameters of the lithography tool further comprises:
generating the values of the control parameters of the lithography tool based at least in part on the ADI flag data from the one or more subsequent layers on the at least one production sample in the previous lot.

23. The process control system of claim 18, wherein the ADI flag data of a metrology target is generated by analyzing one or more regions of interest of the metrology target based on a target metric.

24. The process control system of claim 23, wherein the metrology target includes a periodic structure, wherein the target metric comprises:
decomposing at least one of the one or more regions into a periodic component, a linear component, and a noise component.

25. The process control system of claim 24, wherein the target metric further comprises:
at least one of a strength of the periodic component, a ratio of the strength of the periodic component to a strength of the noise component.

26. The process control system of claim 23, wherein the metrology target includes a periodic structure, wherein the target metric comprises:
a measure of the symmetry of the one or more regions of interest.

27. The process control system of claim 18, wherein the ADI metrology tool has a higher throughput than the AEI metrology tool.

28. The process control system of claim 18, wherein the AEI metrology tool has a higher resolution than the ADI metrology tool.

29. The process control system of claim 18, wherein the ADI overlay data and the ADI flag data are generated using a composite metrology recipe.

30. The process control system of claim 29, wherein the composite recipe includes a first set of sampling locations for measuring the ADI overlay data and a second set of sampling locations for measuring the ADI flag data.

31. The process control system of claim 30, wherein the first set of sampling locations is larger than the second set of sampling locations.

32. The process control system of claim 18, wherein the ADI overlay data and the ADI flag data are generated on different metrology targets.

33. The process control system of claim 18, wherein the ADI overlay data and the ADI flag data are generated on different cells of common metrology targets.

34. The process control system of claim 18, wherein the ADI tool comprises:
an optical metrology tool.

35. The process control system of claim 18, wherein the AEI tool comprises:
a particle-beam metrology tool.

36. The process control system of claim 35, wherein the particle-beam metrology tool comprises:
at least one of an electron beam metrology tool or an ion-beam metrology tool.

37. A process control system, comprising:
an after-development inspection (ADI) tool;
an after-etch inspection (AEI) tool;
a lithography tool for fabricating a current layer; and
a controller configured to communicatively couple to the ADI tool, the AEI tool, and the lithography tool to provide control parameters to maintain overlay error between the current layer and one or more previous layers within a selected specification, the controller including one or more processors configured to execute program instructions configured to cause the one or more processors to:
receive after-development inspection (ADI) data after a lithography step for the current layer from the ADI tool, the ADI data including ADI overlay data indicative of overlay errors between the current layer and the one or more previous layers, the ADI data further including ADI flag data indicative of process deviations during fabrication of the one or more previous layers;
receive after etch inspection (AEI) overlay data after an exposure step of the current layer from the AEI tool, the AEI overlay data indicative of overlay errors between the current layer and the one or more previous layers, wherein a non-zero offset corresponds to a difference between overlay error determined from ADI data and AEI overlay data;
train a non-zero offset predictor with ADI data and AEI overlay data from one or more training samples to predict a non-zero offset from ADI data;
generate values of the control parameters of the lithography tool fabricating the current layer of at least one production sample using ADI data from one or more previous production samples and non-zero offsets generated by the non-zero offset predictor based on the ADI data from the one or more previous production samples; and
provide the values of the control parameters to the lithography tool for fabricating the current layer on the at least one production sample.

38. A non-zero offset predictor, comprising:
a controller including one or more processors configured to execute program instructions configured to cause the one or more processors to:
receive training data, the training data including:
after-development inspection (ADI) data after a lithography step for a current layer from an ADI tool, the ADI data including ADI overlay data indicative of overlay errors between the current layer and one or more previous layers, the ADI data further including ADI flag data indicative of process deviations during fabrication of the one or more previous layers;
after etch inspection (AEI) overlay data after an exposure step of the current layer from an AEI tool, the AEI overlay data indicative of overlay errors between the current layer and the one or more previous layers, wherein a non-zero offset corresponds to a difference between overlay error determined from ADI data and AEI overlay data;
predict values of the non-zero offset using ADI data from one or more previous production samples and the training data;
provide the non-zero offset to a process controller for adjusting values of control parameters of a lithography tool for fabricating the current layer on at least one production sample.

39. A process control method, comprising:
receiving after-development inspection (ADI) data after a lithography step for a current layer from an ADI tool, the ADI data including ADI overlay data indicative of overlay errors between the current layer and one or more previous layers, the ADI data further including ADI flag data indicative of process deviations during fabrication of the one or more previous layers;
receiving after etch inspection (AEI) overlay data after an exposure step of the current layer from an AEI tool, the AEI overlay data indicative of overlay errors between the current layer and the one or more previous layers, wherein a non-zero offset corresponds to a difference between overlay error determined from ADI data and AEI overlay data;
training a non-zero offset predictor with ADI data and AEI overlay data from one or more training samples to predict a non-zero offset from ADI data;
generating values of control parameters of a lithography tool for fabricating the current layer of at least one production sample using ADI data from one or more previous production samples and non-zero offsets generated by the non-zero offset predictor based on the ADI data from the one or more previous production samples, wherein the control parameters maintain overlay error between the current layer and the one or more previous layers within a selected tolerance; and
providing the values of the control parameters to the lithography tool for fabricating the current layer on the at least one production sample.

* * * * *